United States Patent
Apalkov et al.

(10) Patent No.: US 8,399,941 B2
(45) Date of Patent: Mar. 19, 2013

(54) MAGNETIC JUNCTION ELEMENTS HAVING AN EASY CONE ANISOTROPY AND A MAGNETIC MEMORY USING SUCH MAGNETIC JUNCTION ELEMENTS

(75) Inventors: Dmytro Apalkov, San Jose, CA (US); Mohamad Towfik Krounbi, San Jose, CA (US)

(73) Assignee: Grandis, Inc., San Jose, CA (US)

( * ) Notice: Subject to any disclaimer, the term of this patent is extended or adjusted under 35 U.S.C. 154(b) by 46 days.

(21) Appl. No.: 12/940,926

(22) Filed: Nov. 5, 2010

(65) Prior Publication Data

US 2012/0112295 A1 May 10, 2012

(51) Int. Cl.
*H01L 29/82* (2006.01)

(52) U.S. Cl. ........... 257/421; 257/295; 257/E27.008; 257/E29.164; 257/E29.167; 257/E29.272

(58) Field of Classification Search .......... 257/421, 257/E29.323, 295, E43.001–E43.007, E27.005–E27.006, 257/E27.008, E29.164, E29.167, E29.272

See application file for complete search history.

(56) References Cited

U.S. PATENT DOCUMENTS

| | | | |
|---|---|---|---|
| 6,532,164 B2 | 3/2003 | Redon et al. | |
| 6,611,405 B1 | 8/2003 | Inomata et al. | |
| 6,829,161 B2 | 12/2004 | Huai et al. | |
| 6,844,605 B2 | 1/2005 | Nishimura | |
| 6,865,109 B2 * | 3/2005 | Covington | 365/173 |
| 6,909,630 B2 * | 6/2005 | Tsang | 365/158 |
| 6,967,863 B2 | 11/2005 | Huai et al. | |
| 6,992,359 B2 | 1/2006 | Huai et al. | |
| 7,057,862 B2 * | 6/2006 | Kasiraj et al. | 360/324.12 |
| 7,057,921 B2 | 6/2006 | Valet | |
| 7,088,609 B2 | 8/2006 | Valet | |
| 7,101,600 B1 | 9/2006 | Kim | |
| 7,161,829 B2 | 1/2007 | Huai et al. | |
| 7,190,611 B2 | 3/2007 | Nguyen et al. | |
| 7,242,045 B2 | 7/2007 | Nguyen et al. | |
| 7,329,935 B2 * | 2/2008 | Rizzo et al. | 257/422 |
| 7,486,551 B1 | 2/2009 | Li et al. | |
| 7,486,552 B2 * | 2/2009 | Apalkov et al. | 365/173 |
| 7,489,541 B2 | 2/2009 | Pakala et al. | |
| 7,502,249 B1 | 3/2009 | Ding | |
| 7,531,882 B2 * | 5/2009 | Nguyen et al. | 257/421 |
| 7,532,505 B1 | 5/2009 | Ding | |
| 7,813,202 B2 * | 10/2010 | Rodmacq et al. | 365/209 |

(Continued)

FOREIGN PATENT DOCUMENTS

EP 2182532 A1 5/2010

OTHER PUBLICATIONS

Extended European Search Report for 11865200-2210 dated Feb. 2, 2012.

(Continued)

*Primary Examiner* — Marcos D. Pizarro
*Assistant Examiner* — Bilkis Jahan
(74) *Attorney, Agent, or Firm* — Convergent Law Group LLP

(57) ABSTRACT

A method and system for providing a magnetic junction usable in a magnetic device are described. The magnetic junction includes a pinned layer, a nonmagnetic spacer layer, and a free layer. The nonmagnetic spacer layer is between the pinned layer and the free layer. The free layer has an easy cone magnetic anisotropy. The magnetic junction is configured such that the free layer is switchable between a plurality of stable magnetic states when a write current is passed through the magnetic junction.

31 Claims, 6 Drawing Sheets

U.S. PATENT DOCUMENTS

| | | | |
|---|---|---|---|
| 2002/0105827 A1 | 8/2002 | Redon et al. | |
| 2003/0007398 A1 | 1/2003 | Daughton et al. | |
| 2003/0059588 A1 | 3/2003 | Hannah et al. | |
| 2003/0227807 A1 | 12/2003 | Nakamura et al. | |
| 2004/0109339 A1* | 6/2004 | Tsang | 365/98 |
| 2004/0246776 A1* | 12/2004 | Covington | 365/173 |
| 2005/0040433 A1 | 2/2005 | Nozieres et al. | |
| 2005/0104101 A1 | 5/2005 | Sun et al. | |
| 2005/0174702 A1 | 8/2005 | Gill | |
| 2005/0185455 A1* | 8/2005 | Huai | 365/171 |
| 2006/0081953 A1* | 4/2006 | Nguyen et al. | 257/421 |
| 2007/0074317 A1* | 3/2007 | Pakala et al. | 977/935 |
| 2007/0097730 A1* | 5/2007 | Chen et al. | 365/158 |
| 2011/0080221 A1* | 4/2011 | Lee et al. | 331/107 R |

OTHER PUBLICATIONS

Japanese abstract of publication No. 11-120758, Apr. 30, 1999, Non-volatile Random Access Memory, Eric Maiken.

Alam, et al., "On-Chip Clocking for Nanomagnet Logic Devices", IEEE Transactions on Nanotechnology (2009).

Albert, et al., "Polarized Current Switching of a CO Thin Film Nanomagnet", American Institute of Physics, 77(23):3809-11 (2000).

Berger, "Emission of spin waves by a magnetic multilayer traversed by a current", Physical Review B, 54(13)9953-58 (1996).

Fromter, et al., "Imaging the Cone State of the Spin Reorientation Transition", Physical Review Letters, 100:207202-1-4 (2008).

Katine, et al., "Current-Driven Magnetization Reversal and Spin-Wave Excitations in Co/Cu/Co Pillars", Physical Review Letters, 84(14):3149-52 (2000).

Nishimura, et al., "Magnetic tunnel junction device with perpendicular magnetization films for high-density magnetic random access memory", J. of Applied Physics, 90(8):5246-49 (2002).

Slonczewski, Conductance and exchange coupling of two ferromagnets separated by a tunneling barrier, Physical Review B, 39(10):6995-7002 (1989).

Slonczewski, "Current-driven excitation of magnetic multilayers", J. of Magnetism and Magnetic Materials, 159:L1-L7 (1996).

Slonczewski, "Theory and Application of Exchange-Driven Switching", IEEE, pp. CE-02 (2000).

Stillrich, et al., "Magnetic anisotropy and the cone state in Co/Pt multiplayer films", J. of Applied Physics, 105:07C308 (2009).

Varga, et al., "Experimental Demonstration of Non-Majority, Nanomagnet Logic Gates" (2009).

Varga, et al., "Programmable Nanomagnetic-Logic Majority Gate" (2010).

PCT International Search Report and Written Opinion of the ISA, application No. PCT/US08/64794.

PCT International Search Report and Written Opinion of the ISA, application No. PCT/US08/66369.

PCT International Search Report and Written Opinion of the ISA, application No. PCT/US10/47941.

PCT International Search Report and Written Opinion of the ISA, application No. PCT/US10/59184.

Office Action issued Apr. 2008 for U.S. Appl. No. 11/239,939.
Office Action issued Sep. 2008 for U.S. Appl. No. 11/239,939.
Office Action issued Jan. 2010 for U.S. Appl. No. 12/133,671.
Office Action issued Apr. 2009 for U.S. Appl. No. 12/133,671.
Office Action issued Mar. 2011 for U.S. Appl. No. 12/638,902.

* cited by examiner

US 8,399,941 B2

MAGNETIC JUNCTION ELEMENTS HAVING AN EASY CONE ANISOTROPY AND A MAGNETIC MEMORY USING SUCH MAGNETIC JUNCTION ELEMENTS

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

When used in STT-RAM applications, the free layer 21 of the conventional MTJ 10 is desired to be switched at a relatively low current. The critical switching current ($I_{c0}$) is the lowest current at which the infinitesimal precession of free layer magnetization 21 around the equilibrium orientation becomes unstable. For example, $I_{c0}$ may be desired to be on the order of a few mA or less. In addition, a short current pulse is desired to be used in programming the conventional magnetic element 10 at higher data rates. For example, current pulses on the order of 20-30 ns or less are desired.

Although the conventional MTJ 10 may be written using spin transfer and used in an STT-RAM, there are drawbacks. For example, the write error rates may be higher than desired for memories having an acceptable $I_{c0}$ and pulse width. The write error rate (WER) is the probability that a cell (i.e. the magnetization 21 of free layer 20 of the conventional magnetic junction) is not switched when subjected to a current that is at least equal to the typical switching current. The WER is desired to be $10^{-9}$ or less. However, the conventional free layer 20 typically has a WER greatly in excess of this value. In addition, it has been determined that the WER may be challenging to improve for shorter write current pulses. For example, FIG. 2 is a graph 50 depicts trends in WERs for pulses of different widths. Note that actual data are not plotted in the graph 50. Instead, the graph 50 is meant to indicate trends. The pulse width, from longest to shortest, is for curves 52, 54, 56, and 58. As can be seen in the graph 50, for higher pulse widths, the WER versus write current has a higher slope. Thus, application of a higher write current for the same pulse width may bring about a significant reduction in the WER. However, as the pulse widths shorten in curves 54, 56, and 58, the slope of the curves 54, 56, and 58 decreases. For a decreasing pulse width, an increase in current is less likely to bring about a reduction in the WER. Consequently, memories employing the conventional MTJ 10 may have unacceptably high WER that may not be cured by an increase in write current.

Various conventional solutions have been proposed to improve characteristics such as the WER. For example, magnetic field assisted switching and/or a magnetic junction having a complex structure may be used. However, the ability of such conventional schemes to reduce the WER while preserving other characteristics is limited. For example, scalability, energy consumption, and/or thermal stability may be adversely affected by such conventional methods. Thus, performance of a memory using the conventional MTJ is still desired to be improved.

Accordingly, what is needed is a method and system that may improve the performance of the spin transfer torque based memories. The method and system described herein address such a need.

BRIEF SUMMARY OF THE INVENTION

A method and system for providing a magnetic junction usable in a magnetic device are described. The magnetic junction includes a pinned layer, a nonmagnetic spacer layer, and a free layer. The nonmagnetic spacer layer is between the pinned layer and the free layer. The free layer has an easy cone magnetic anisotropy. The magnetic junction is configured such that the free layer is switchable between a plurality of stable magnetic states when a write current is passed through the magnetic junction.

DETAILED DESCRIPTION OF THE INVENTION

Figure 1:
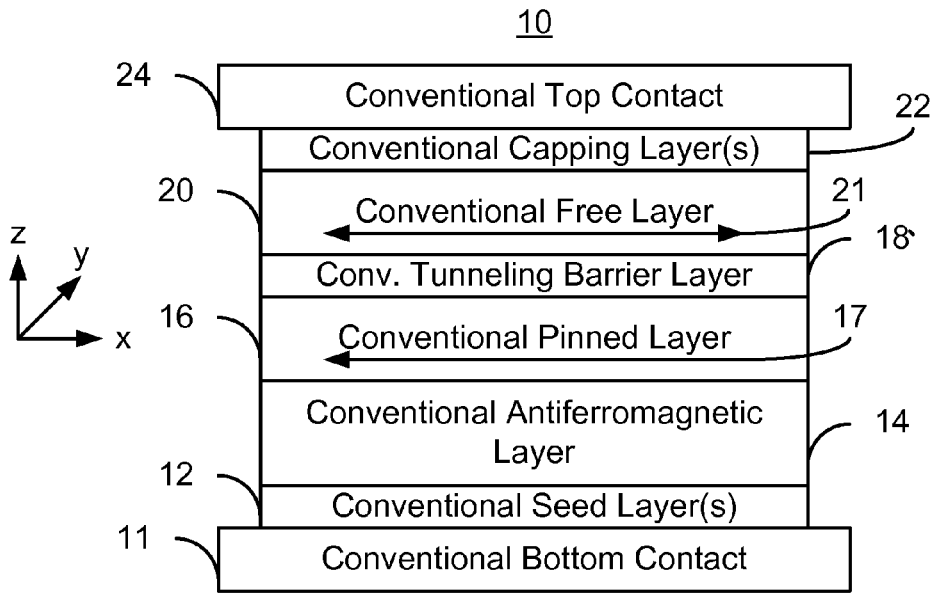
FIG. 1 depicts a conventional magnetic junction.
Figure 2:
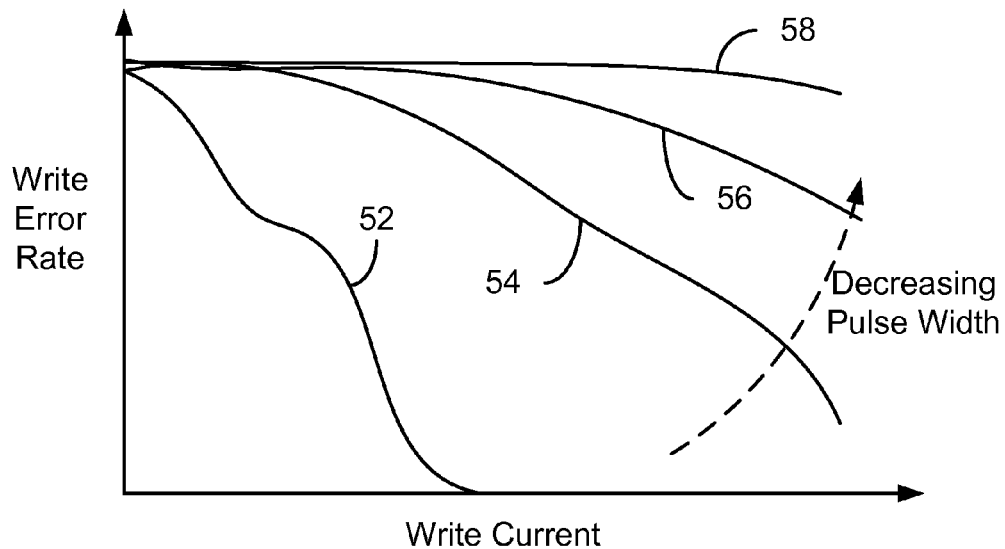
FIG. 2 is a graph depicting trends in write current versus write error rate.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic junction includes a pinned layer, a nonmagnetic spacer layer, and a free layer. The nonmagnetic spacer layer is between the pinned layer and the free layer. The free layer has an easy cone magnetic anisotropy. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction.

Conversely, "perpendicular" corresponds to a direction that is substantially perpendicular to one or more of the layers of the magnetic junction.

Figure 3:
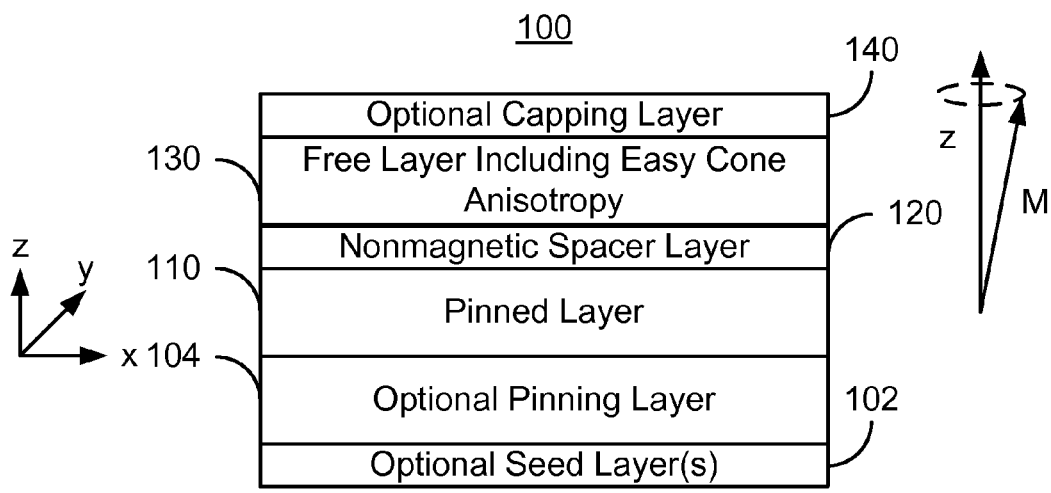
FIG. 3 depicts an exemplary embodiment of a magnetic junction including a free layer having an easy cone anisotropy.

FIG. 3 depicts an exemplary embodiment of a magnetic junction 100 use in a magnetic device, for example a magnetic memory such as an STT-RAM. For clarity, FIG. 3 is not to scale. The magnetic junction 100 includes a pinned layer 110, a nonmagnetic spacer layer 120, and a free layer 130. Also shown is optional pinning layer 104, which may be used to fix the magnetization (not shown) of the pinned layer 110. In some embodiments, the optional pinning layer 104 may be an AFM layer or multilayer that pins the magnetization (not shown) of the pinned layer 110 by an exchange-bias interaction. However, in other embodiments, the optional pinning layer 104 may be omitted or another structure may be used. Further, the magnetic junction 100 may include other and/or additional layers such as optional seed layer(s) 102 and/or optional capping layer(s) 140. The magnetic junction 100 is also configured to allow the free layer 130 to be switched between stable magnetic states when a write current is passed through the magnetic junction 100. Thus, the free layer 130 is switchable utilizing spin transfer torque.

The pinned layer 110 is magnetic and thus may include one or more of Ni, Fe, and Co, particularly in an alloy form. Although depicted as a simple layer, the pinned layer 110 may include multiple layers. For example, the pinned layer 110 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 110 may also be another multilayer. Although a magnetization is not depicted in FIG. 3, the free layer may have a perpendicular anisotropy energy that exceeds the out-of-plane demagnetization energy. In the embodiment shown, the axis of symmetry of the easy cone is substantially normal to the plane of the free layer. In another embodiment, the perpendicular anisotropy in the free layer may be less than the out-of-plane demagnetization energy. In such a case, the axis of symmetry of the easy cone is substantially in the plane of the free layer The spacer layer 120 is nonmagnetic. In some embodiments, the spacer layer 120 is an insulator, for example a tunneling barrier. In such embodiments, the spacer layer 120 may include crystalline MgO, which may enhance the tunneling magnetoresistance (TMR) of the magnetic junction. In other embodiments, the spacer layer may be a conductor, such as Cu. In alternate embodiments, the spacer layer 120 might have another structure, for example a granular layer including conductive channels in an insulating matrix.

The free layer 130 is magnetic and thus may include at least one of Fe, Ni, and/or Co. The free layer 130 has a changeable magnetization (not shown) that may be switched via spin transfer. The free layer 130 is depicted as a single layer. In other embodiments, described below, the free layer 130 may include other layer(s).

In addition, the free layer 130 has an easy cone magnetic anisotropy. An easy cone anisotropy is shown by the magnetization M, in FIG. 3. Because of the easy cone anisotropy, the total magnetization of the free layer 130 has stable states at an angle from the direction perpendicular to the plane of the layers of the magnetic junction 100 (i.e. the z-axis in FIG. 3). The angle is also less than ninety degrees from the z-axis. Thus, there is a perpendicular to plane component of the magnetization. In the embodiment shown, the symmetry axis of the easy cone to be along z direction. However, in other embodiments, the symmetry axis of the easy cone may be in another direction, for example along the in-plane x or y directions.

Figure 4:
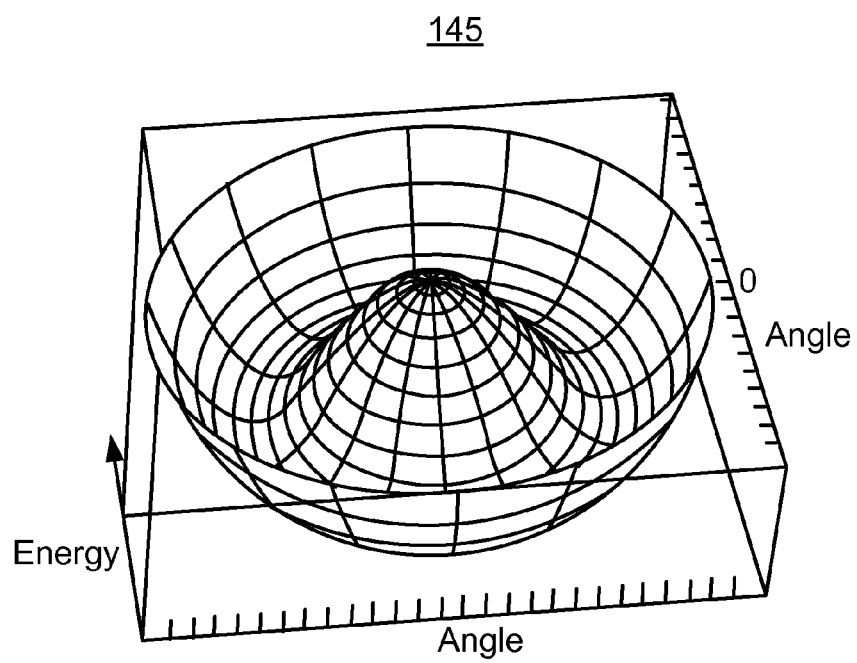
FIG. 4 depicts exemplary embodiments of the anisotropy energy for a free layer magnetization.

The easy cone anisotropy may be understood with reference to FIGS. 3 and 4. FIG. 4 depicts one embodiment of the magnetic anisotropy energy 145 for the free layer 130. Referring to FIGS. 3 and 4, for an easy cone anisotropy, the magnetic anisotropy energy 145 has a local maximum at or near the normal to the plane of the magnetic junction 100. In the embodiment shown, the local maximum is at or near zero degrees from the z-axis. In some embodiments, the local maximum is at least ten times $k_b T$, where $k_b$ is Boltzman's constant and T is the operating temperature of the magnetic junction. In other embodiments, the local maximum is at least twenty $k_b T$. In addition, the magnetic anisotropy energy 145 has a local minimum at some angle from the local maximum. The magnetization of the free layer 130 is stable along the local minimum. Thus, as can be seen by the magnetization M in FIG. 3 and the energy 145, the free layer magnetization is stable at some angle around the z-axis. These stable states form a cone around the normal to the plane of the layers of the magnetic junction 100. Hence, the free layer 130 magnetic anisotropy is termed an easy cone anisotropy.

The introduction of the easy cone anisotropy in the free layer 130 may improve the switching characteristics of the free layer 130. Because of the easy cone anisotropy, the free layer 130 magnetization may have a stable state canted from alignment with the normal to the layers of the magnetic junction 100 (e.g. canted from the z-axis). This initial nonzero angle allows the magnetization of the free layer 130 to be more easily switched by a spin transfer torque. This characteristic corresponds to a lower write error rate. The lower WER may be achieved even at low pulse widths (high data rates). In particular, the slope of the write error rate versus write current may remain sufficiently large even for pulse widths of less than ten ns. In some embodiments, an acceptable write error rate of $10^{-9}$ or less may be achieved for pulse widths of 10-30 ns or less. Thus, instead of assisting switching using a mechanism such as an external field, the easy cone anisotropy treats the physical cause of the high error rates. Consequently, the free layer 130 may have an improved write error rate even for lower pulse widths.

Other properties of the magnetic junction 100 may also be enhanced. The thermal stability and symmetry of the magnetic junction 100 may not be adversely affected. The magnitude of the local maximum in the magnetic anisotropy energy 145 at 0 degrees from the z-axis may be twenty times $k_b T$ or more. In some embodiments, the local maximum is at least sixty times $k_b T$. A local maximum of this magnitude may be sufficient to ensure thermal stability of the magnetic junction 100. Further, because an external magnetic field may not be required to switch the magnetic junction 100, the magnetic junction 100 may be better scalable to higher memory densities. Performance and flexibility of the magnetic junction 100 and a memory using the magnetic junction 100 may thus be improved.

Figure 5:
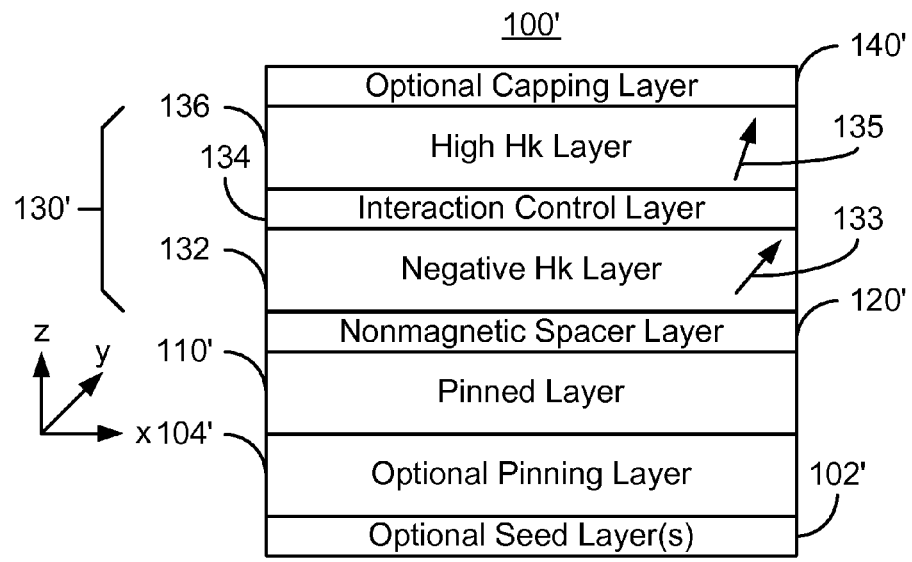
FIG. 5 depicts an exemplary embodiment of a magnetic element including a free layer having an easy cone anisotropy.

The easy cone anisotropy for the free layer may be achieved in a number of ways. FIG. 5 depicts an exemplary embodiment of a magnetic junction 100' including a free layer having an easy cone anisotropy. For clarity, FIG. 5 is not to scale. The magnetic junction 100' may be used in magnetic memory such as an STT-RAM. The magnetic junction 100' is analogous to the magnetic junction 100, and thus includes similar structures. The magnetic junction 100' includes optional seed layer(s) 102', an optional pinning layer 104', a pinned layer 110', a nonmagnetic spacer layer 120', a free layer 130' and optional capping layer(s) 140' that are analogous to the optional seed layer(s) 102, optional pinning layer 104, the pinned layer 110, the nonmagnetic spacer layer 120, the free layer 130, and optional capping layer(s) 140, respectively. The layers 110', 120', 130', and 140' have a structure and function analogous to those of the layers 110, 120, 130, and 140, respectively.

The free layer 130' includes multiple layers. In particular, magnetic layers 132 and 136 separated by nonmagnetic exchange interaction control layer 134 are shown. In the embodiment shown, one magnetic layer 132 has a negative perpendicular anisotropy, $H_k$. Thus, by itself, the magnetization of this layer would stay in the plane of the film. In some embodiments, the layer 132 may include the effect of partial perpendicular anisotropy. This effect reduces the field required to saturate the magnetization of this layer along the z direction. In the some embodiments, the partial perpendicular anisotropy is at least twenty percent of $4\pi M_s$ and less than ninety percent of $4\pi M_s$. The other magnetic layer 136 has a high perpendicular anisotropy $H_k$. In some embodiments, the magnitude of the high perpendicular anisotropy depends upon the size of the magnetic junction. For example, for a larger magnetic junction 100', having a diameter on the order of one hundred nanometers in diameter, the large $H_k$ may be greater than one thousand Oersted (1 kOe). In contrast, for a smaller magnetic junction 100' having a diameter on the order of ten nanometers, $H_k$ is approximately five thousand Oersted (5 kOe). The layers 132 and 136 are ferromagnetic and thus include one or more of Fe, Co, and Ni. Other materials including but not limited to B, Ta, Cs, Zr, Pt, Pd, Tb, and/or Ru may also be included in the layers 132 and 136. Note that the same or different materials may be used for the layers 132 and 136. The combination of the material(s) used and/or the thicknesses of the layers 132 and 136, as well as the exchange interaction control layer 134, may be tailored such that the desired anisotropics are produced in the layers 132 and 136.

The free layer 130' also includes interaction control layer 134. The interaction control layer may be used to manage magnetic interactions, such as exchange interactions, between the magnetic layers 132 and 136. The interaction control layer 134 is nonmagnetic. For example, Ta, Cr, Mg, MgO, Ti, W, and/or Ru might be used for the interaction control layer 134. The thickness of the interaction control layer 134 may also vary. In some embodiments, the interaction control layer 134 is at least 0.1 nm and not more than 1.5 nm. For example, if Ru is used, the interaction control layer 134 may be at least 0.3 nm and not greater than 1.3 nm. If Ta is used, then the interaction control layer 134 may be at least 0.1 nm and not more than 1.0 nm.

Figure 6:
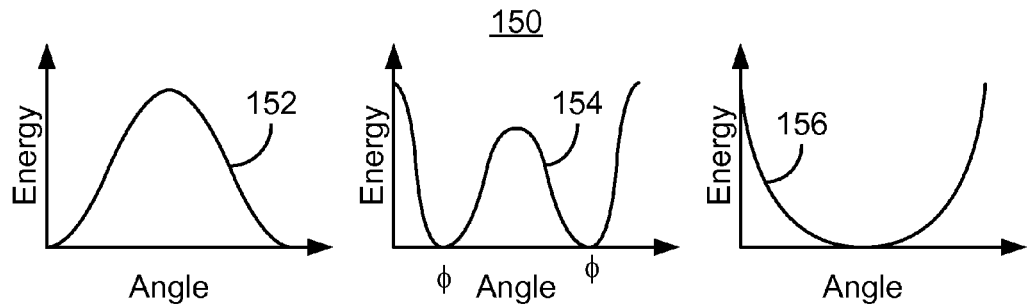
FIG. 6 depicts an exemplary embodiment of the anisotropy energy for various magnetic junctions.

The use of the interaction control layer 134 may be seen with reference to FIG. 6, which depicts the total energy versus angle for various magnetic exchange interactions. For simplicity, the curves in FIG. 6 are depicted in two dimensions as the magnetic junction 100' may (but need not be) symmetric around the z-axis. Referring to FIGS. 5-6, the curve 152 depicts the magnetic anisotropy energy versus angle for a very low exchange coupling between the layers 132 and 136. The curve 154 depicts the magnetic anisotropy energy versus angle for an intermediate exchange coupling between the layers 132 and 136. In the embodiment shown, the exchange coupling is on the order of $1.5 \times 10^{-4}$ J/m². In general, the exchange coupling is on the order of $0.5 \times 10^{-4}$ J/m²-$20 \times 10^{-4}$ J/m². The curve 156 depicts the magnetic anisotropy energy versus angle for a high exchange coupling between the layers 132 and 136. As can be seen in the curves 152 and 156, for low and high exchange couplings, there is no local maximum surrounded by the local minimum for the easy cone anisotropy. However, for an intermediate exchange coupling, the magnetic anisotropy energy has a local maximum near zero degrees from the normal to the surface.

Figure 7:
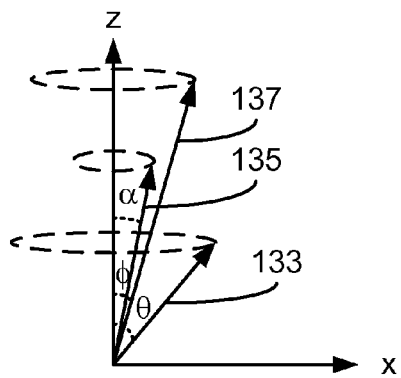
FIG. 7 depicts the magnetic moments of the free layer having an easy cone anisotropy.

The magnetization of the free layer 130' may be seen with reference to FIG. 7, which depicts one embodiment of the magnetization for the free layer 130' having an easy cone anisotropy. Referring to FIGS. 5-7, the negative perpendicular anisotropy layer 132 has a magnetization 133. If there were no interactions between the magnetic layers 132 and 136, the magnetization 133 would lie in plane. However, because of the exchange interaction between the layers 132 and 136, the magnetization 133 is at an angle 8 from the z-axis (normal to the plane of the magnetic junction 100'). The high perpendicular anisotropy layer 136 has a magnetization 135. This magnetization 135 may lie along the z-axis in the absence of the other layer 132. However, because of the exchange interaction, the magnetization 135 is at an angle α from the z-axis. The total magnetization of the free layer 130' is given by magnetization 137. The total magnetization 137 lies at an angle φ from the z-axis. This angle φ corresponds to the minima in the energy curve 154.

The effect of the easy cone anisotropy may be understood mathematically. The magnetic anisotropy energy per unit area of the free layer 130' may be given as a function of angle from a particular direction by:

$$E(\theta,\alpha) = -H_{K,132} * M_{132} * t_{132} * \cos^2(\theta) - H_{K,136} * M_{136} * t_{136} * \cos^2(\alpha) + \sigma * \cos(\theta - \alpha)$$

Where $H_{K,132}$ is the effective perpendicular anisotropy field for layer 132; $M_{132}$ is the magnetization of the layer 132; $t_{132}$ is the thickness of the layer 132; $H_{K,136}$ is the effective perpendicular anisotropy field for layer 136; $M_{136}$ is the saturation magnetization of the layer 136, $t_{136}$ is the thickness of the layer 136, and σ is areal exchange energy density. The net result is that the magnetization 137 of the free layer is stable in an angle from the z-axis, as shown in FIG. 7. The free layer 130' thus exhibits easy cone anisotropy. As discussed above, the free layer 130' has an easy cone anisotropy. Consequently, improved switching characteristics, thermal stability, and scalability may be achieved.

Figure 8:
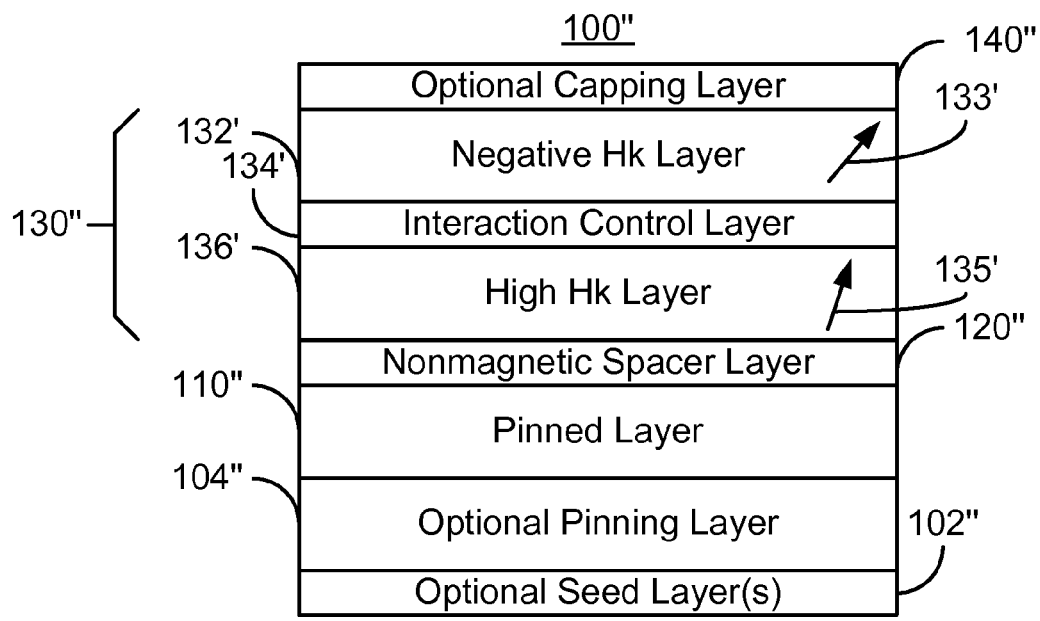
FIG. 8 depicts an exemplary embodiment of a magnetic junction including a free layer having an easy cone anisotropy.

FIG. 8 depicts an exemplary embodiment of a magnetic junction 100" including a free layer having easy cone anisotropy. For clarity, FIG. 8 is not to scale. The magnetic junction 100" may be used in magnetic memory such as an STT-RAM. The magnetic junction 100" is analogous to the magnetic junctions 100 and 100', and thus includes similar structures. The magnetic junction 100" includes optional seed layer(s) 102", an optional pinning layer 104", a pinned layer 110", a nonmagnetic spacer layer 120", a free layer 130" and optional capping layer(s) 140" that are analogous to the optional seed layer(s) 102/102', optional pinning layer 104/104', the pinned layer 110/110', the nonmagnetic spacer layer 120/120', the free layer 130/130', and optional capping layer(s) 140/140', respectively. The layers 110", 120", 130", and 140" have a structure and function analogous to those of the layers 110/110', 120/120', 130/130', and 140/140', respectively.

The free layer 130" includes multiple layers. In particular, magnetic layers 132' and 136' separated by nonmagnetic exchange control layer 134' are shown. However, the positions of the layers 132' and 136 have switched from the magnetic junction 100'. In the embodiment shown, one magnetic layer 132' has a negative perpendicular anisotropy, $H_k$ and is further from the pinned layer 110" than the layer 136'. The other magnetic layer 136' has a high perpendicular anisotropy $H_k$. The materials and thicknesses of the layers 132' and 136' are analogous to those of the layers 132 and 136. This layer 136' is closer to the pinned layer 110" than the layer 132'. Despite the change in positions of the magnetic layers 132' and 136', the free layer 130" still retains an easy cone anisotropy. Thus, the magnetic junction 100" functions in an analogous manner to and may share the benefits of the magnetic junctions 100 and 100'.

Figure 9:
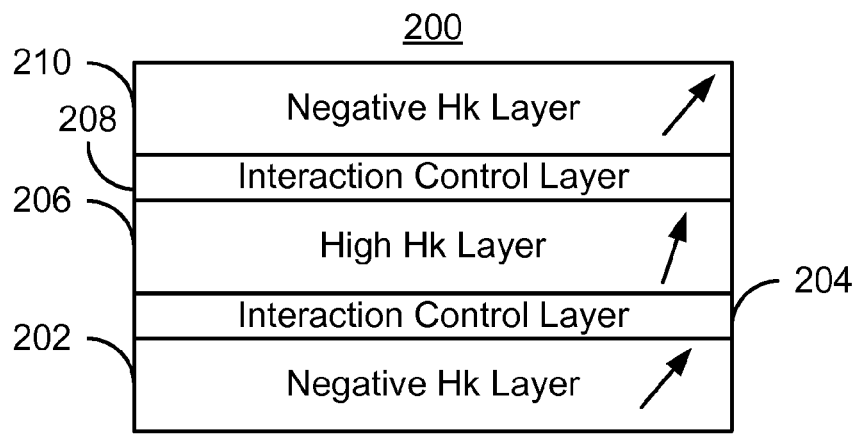
FIG. 9 depicts another exemplary embodiment of a free layer having an easy cone anisotropy usable in a magnetic junction.

FIG. 9 depicts an exemplary embodiment of another free layer 200 that might be usable in the magnetic junction 100, 100' and/or 100". For clarity, FIG. 9 is not to scale. The free layer 200 is analogous to the free layer 130/130'/130" and thus includes similar structures. The free layer 200 includes negative perpendicular anisotropy layers 202 and 210, high perpendicular anisotropy layer 206, and interaction control layers 204 and 208. Layers 202 and 210 are analogous to layers 132/132', while layer 206 is analogous to the layers 136/136'. Similarly, interaction control layers 204 and 208 are analogous to interaction control layers 134/134'. In the free layer 200, the high perpendicular anisotropy layer 206 is sandwiched between two negative anisotropy layers 202 and 208. The resulting free layer 200 may have an easy cone anisotropy. Thus, when used in a magnetic junction, the free layer 200 may have an improved write error rate without sacrificing thermal stability, scalability, or low critical switching current.

Figure 10:
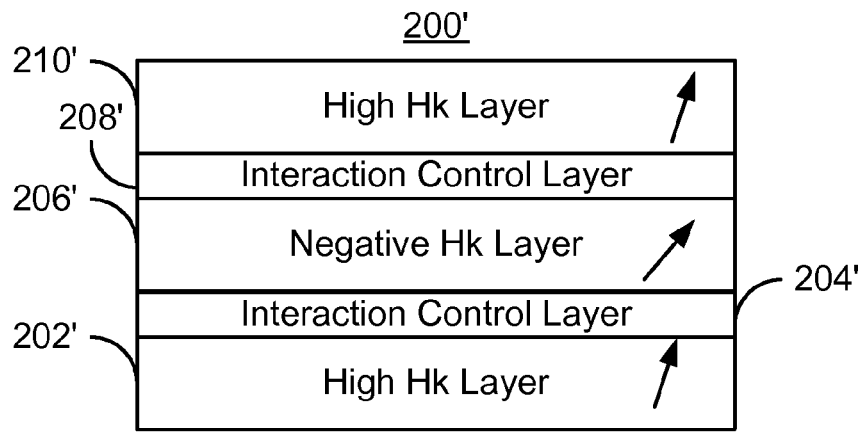
FIG. 10 depicts another exemplary embodiment of a free layer having an easy cone anisotropy usable in a magnetic junction.

FIG. 10 depicts an exemplary embodiment of another free layer 200' that might be usable in the magnetic junction 100, 100' and/or 100". For clarity, FIG. 10 is not to scale. The free layer 200' is analogous to the free layer 130/130'/130"/200 and thus includes similar structures. The free layer 200' includes high perpendicular anisotropy layers 202' and 210', negative perpendicular anisotropy layer 206', and interaction control layers 204' and 208'. Layers 202' and 210' are analogous to layers 136/136'/206, while layer 206' is analogous to the layers 132/132'/202/210. Similarly, interaction control layers 204' and 208' are analogous to interaction control layers 134/134'/204/208. In the free layer 200', the negative perpendicular anisotropy layer 206' is sandwiched between two high anisotropy layers 202' and 210'. The resulting free layer 200' may have an easy cone anisotropy. When used in a junction, therefore, the free layer 200' may have an improved write error rate without sacrificing thermal stability, scalability, or low critical switching current.

Figure 11:
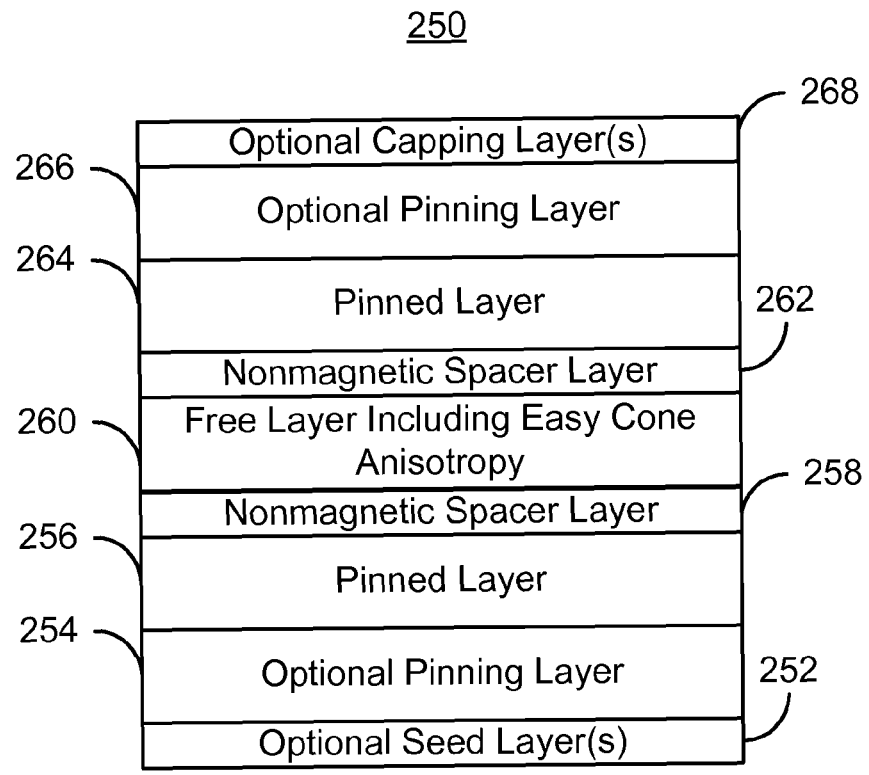
FIG. 11 depicts another exemplary embodiment of a magnetic junction including a free layer having an easy cone anisotropy.

FIG. 11 depicts an exemplary embodiment of another magnetic junction 250 including a free layer having an easy cone anisotropy. For clarity, FIG. 11 is not to scale. The magnetic junction 250 may be used in magnetic memory such as an STT-RAM. The magnetic junction 250 is analogous to the magnetic junctions 100, 100', 100" and thus includes similar structures. The magnetic junction 250 includes optional seed layer(s) 252, an optional pinning layer 254, a pinned layer 256, a nonmagnetic spacer layer 258, a free layer 260 and optional capping layer(s) 268 that are analogous to the optional seed layer(s) 102/102', optional pinning layer 104/104', the pinned layer 110/110', the nonmagnetic spacer layer 120/120', the free layer 130/130', and optional capping layer(s) 140/140', respectively. In addition, the magnetic junction 250 includes an additional nonmagnetic spacer layer 262, an additional pinned layer 264, and an additional optional pinning layer 266. Thus, the magnetic junction 250 is a dual junction. The additional nonmagnetic spacer layer 262, additional pinned layer 264, and additional optional pinning layer 266 are analogous to the nonmagnetic spacer layer 258, the pinned layer 256, and the optional pinning layer 254. Thus, the magnetic junction 250 may share the benefits of the junctions 100, 100' and 100". Further, because the magnetic junction 250 may be a dual junction, such as a dual tunneling junction, the switching current for the magnetic junction 250 may be reduced and the switching characteristics improved.

Figure 12:
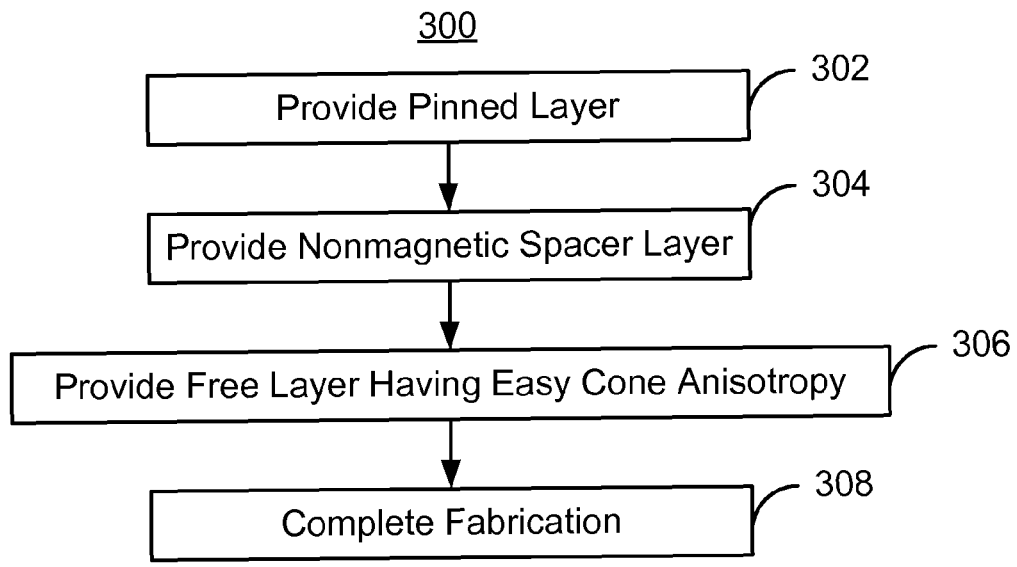
FIG. 12 an exemplary embodiment of a method for fabricating a magnetic junction including a free layer having an easy cone anisotropy.

FIG. 12 depicts an exemplary embodiment of a method 300 for fabricating magnetic substructure. For simplicity, some steps may be omitted or combined. The method 300 is described in the context of the magnetic junction 100. However, the method 300 may be used on other magnetic junctions such as the junctions 100', 100" and/or 250. Further, the method 300 may be incorporated into fabrication of magnetic memories. Thus the method 300 may be used in manufacturing a STT-RAM or other magnetic memory. The method 300 may commence after the seed layer(s) 102 and optional pinning layer 104 are provided.

The pinned layer 110 is provided, via step 302. Step 302 may include depositing the desired materials at the desired thickness of the pinned layer 110. Further, step 302 may include providing a SAF. The nonmagnetic layer 120 is provided, via step 304. Step 304 may include depositing the desired nonmagnetic materials, including but not limited crystalline MgO. In addition, the desired thickness of material may be deposited in step 304.

The free layer 130 having the easy cone anisotropy is provided, via step 306. In some embodiments, step 306 may be completed by depositing a multilayer, such as the free layer 130', 130", 200, and/or 200'. Fabrication is then completed, via step 308. For example, the capping layer 140 may be provided. In other embodiments, the additional spacer layer 262, additional pinned layer 264 and optional additional pinning layer 266 may be provided. In some embodiments, in which the layers of the magnetic junction are deposited as a stack, then defined, step 308 may include defining the magnetic junction 100, performing anneals, or otherwise completing fabrication of the magnetic junction 100. Further, if the magnetic junction 100 is incorporated into a memory, such as an STT-RAM, step 308 may include providing contacts, bias structures, and other portions of the memory. Thus, the magnetic junction 100, 100', 100", and/or 250 is formed. Consequently, the benefits of the magnetic junction may be achieved.

Figure 13:
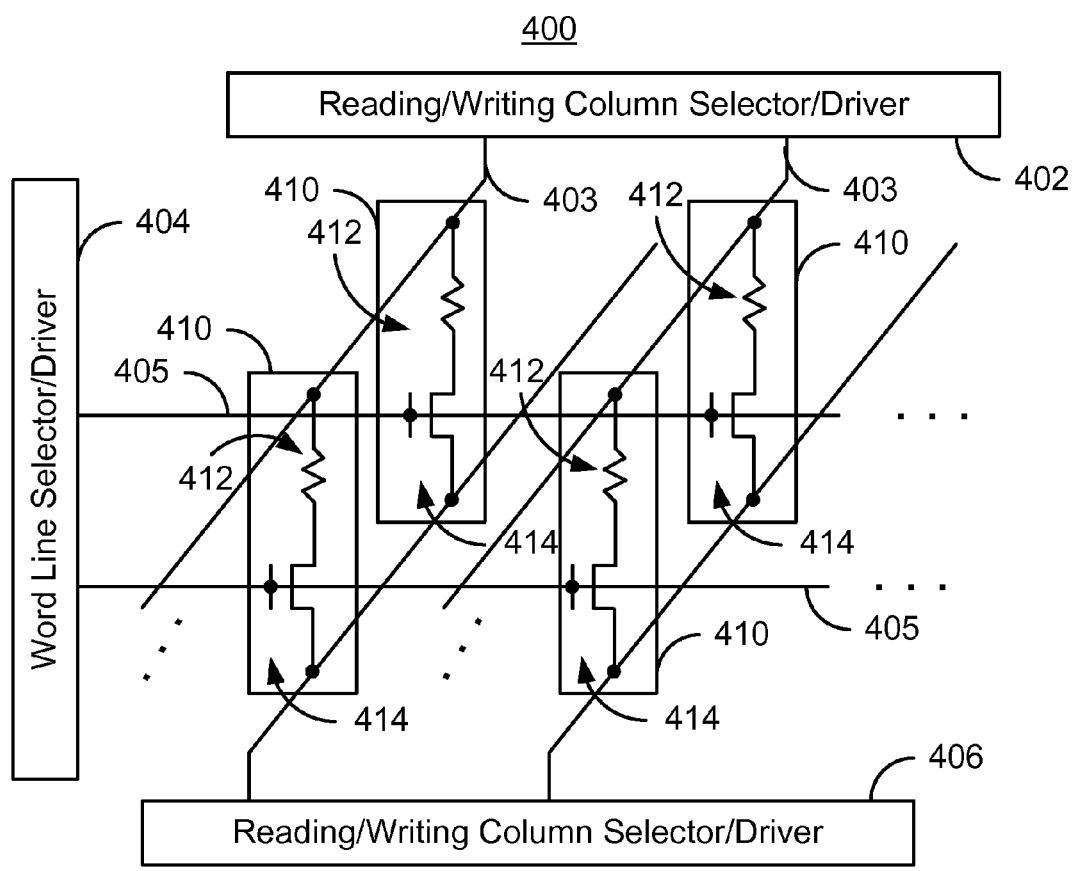
FIG. 13 depicts an exemplary embodiment of a memory utilizing magnetic junctions in the memory element(s) of the storage cell(s).

Further, the magnetic junctions 100, 100', 100", and/or 250 may be used in a magnetic memory. FIG. 13 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 100', 100", and/or 250. Although one magnetic junction 412 is shown per cell 410, in other embodiments, another number of magnetic junctions 412 may be provided per cell. As such, the magnetic memory 400 may enjoy the benefits described above, such as lower soft error rate and a low critical switching current.

Various magnetic junctions 100, 100', 100", and 250 and free layers 130, 130', 130", 200, and 200' have been disclosed. Note that various features of the magnetic junctions 100, 100, and 250 may be combined. Thus, one or more of the benefits of the magnetic junctions 100, 200, 200', and 250, and/or free layers 130, 130', 130", 200, and/or 200' such as reduced write error rate, a perpendicular anisotropy, thermal stability, and/or scalability may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
    a pinned layer;
    a nonmagnetic spacer layer; and
    a free layer having an easy cone magnetic anisotropy, the nonmagnetic spacer layer residing between the pinned layer and the free layer, the free layer having a local magnetic anisotropy energy maximum along an axis, a local magnetic anisotropy energy minimum at an angle from the axis, and a global magnetic anisotropy energy maximum different from the local magnetic anisotropy energy maximum, the angle being greater than zero degrees and less than ninety degrees such that the free layer has the easy cone anisotropy;
    wherein the magnetic junction is configured such that the free layer is switchable between a plurality of stable magnetic states when a write current is passed through the magnetic junction.

2. The magnetic junction of claim 1 wherein the free layer includes a high perpendicular anisotropy layer, a negative perpendicular anisotropy layer, and an interaction control layer between the high perpendicular anisotropy layer and the negative perpendicular anisotropy layer, the high perpendicular anisotropy layer and the negative perpendicular anisotropy layer providing the cone anisotropy.

3. The magnetic junction of claim 2 wherein the high perpendicular anisotropy layer has a perpendicular anisotropy field of at least one thousand Oersted.

4. The magnetic junction of claim 3 wherein the high perpendicular anisotropy field is at least five thousand Oersted.

5. The magnetic junction of claim 2 wherein the interaction control layer includes at least one of Ru, Ta, Mg, MgO, Ti, W, and Cr.

6. The magnetic junction of claim 5 wherein the interaction control layer has a thickness of at least 0.1 nm and not more than 1.5 nm.

7. The magnetic junction of claim 2 wherein the high perpendicular anisotropy layer is closer to the pinned layer than the negative perpendicular anisotropy layer.

8. The magnetic junction of claim 2 wherein the negative perpendicular anisotropy layer is closer to the pinned layer than the high perpendicular anisotropy layer.

9. The magnetic junction of claim 2 wherein the free layer further includes an additional negative perpendicular anisotropy layer and an additional interaction control layer, the additional interaction control layer residing between the high perpendicular anisotropy layer and the additional negative perpendicular anisotropy layer.

10. The magnetic junction of claim 2 wherein the negative perpendicular anisotropy layer further has a partial perpendicular anisotropy.

11. The magnetic junction of claim 1 wherein the free layer has an anisotropy energy having a local maximum substantially at an angle of zero degrees from a direction perpendicular to a plane of the magnetic junction.

12. The magnetic junction of claim 11 wherein the local maximum is at least ten multiplied by Boltzman's constant multiplied by a temperature of the magnetic junction.

13. The magnetic junction of claim 12 wherein the local maximum is at least twenty multiplied by Boltzman's constant multiplied by a temperature of the magnetic junction.

14. The magnetic junction of claim 1 wherein the nonmagnetic spacer layer is a tunneling barrier layer.

15. The magnetic junction of claim 14 wherein the nonmagnetic spacer layer includes crystalline MgO.

16. The magnetic junction of claim 1 further comprising:
    an additional pinned layer; and
    an additional nonmagnetic spacer layer, the additional nonmagnetic spacer layer residing between the additional pinned layer and the free layer.

17. The magnetic junction of claim 16 wherein at least one of the nonmagnetic spacer layer and the additional nonmagnetic spacer layer is a tunneling barrier layer.

18. The magnetic junction of claim 1 wherein the axis is substantially perpendicular-to-plane.

19. A magnetic memory comprising:
    a plurality of magnetic storage cells, each of the plurality of magnetic storage cells including at least one magnetic junction, the at least one magnetic junction including a pinned layer, a nonmagnetic spacer layer, and a free layer having an easy cone magnetic anisotropy, the nonmagnetic spacer layer residing between the pinned layer and the free layer, the free layer having a local magnetic anisotropy energy maximum along an axis, a local magnetic anisotropy energy minimum at an angle from the axis, and a global magnetic anisotropy energy maximum different from the local magnetic anisotropy energy maximum, the angle being greater than zero degrees and less than ninety degrees such that the free layer has the easy cone anisotropy, wherein the magnetic junction is configured such that the free layer is switchable between a plurality of stable magnetic states when a write current is passed through the magnetic junction; and
    a plurality of bit lines.

20. The magnetic memory of claim 19 wherein the free layer includes a high perpendicular anisotropy layer, a negative perpendicular anisotropy layer, and an interaction control layer between the high perpendicular anisotropy layer and the negative perpendicular anisotropy layer, the high perpendicular anisotropy layer and the negative perpendicular anisotropy layer providing the easy cone anisotropy.

21. The magnetic memory of claim 20 wherein the high perpendicular anisotropy layer has a perpendicular anisotropy field of at least one thousand Oersted.

22. The magnetic memory of claim 21 wherein the perpendicular anisotropy field is at least five thousand Oersted.

23. The magnetic memory of claim 20 wherein the free layer further includes an additional negative perpendicular anisotropy layer and an additional interaction control layer, the additional interaction control layer residing between the high perpendicular anisotropy layer and the additional negative perpendicular anisotropy layer.

24. The magnetic memory of claim 20 wherein the negative perpendicular anisotropy layer further has a partial perpendicular anisotropy.

25. The magnetic memory of claim 19 wherein the free layer has an anisotropy energy having a local maximum substantially at an angle of zero degrees from a direction perpendicular to a plane of the magnetic junction.

26. The magnetic memory of claim 25 wherein the local maximum is at least ten multiplied by Boltzman's constant multiplied by a temperature of the magnetic junction.

27. The magnetic memory of claim 26 wherein the local maximum is at least twenty multiplied by Boltzman's constant multiplied by a temperature of the magnetic junction.

28. The magnetic memory of claim 19 wherein each of the plurality of magnetic junctions further includes:
   an additional pinned layer; and
   an additional nonmagnetic spacer layer, the additional nonmagnetic spacer layer residing between the additional pinned layer and the free layer.

29. The magnetic memory of claim 19 wherein the axis is substantially perpendicular-to-plane.

30. A magnetic junction for use in a magnetic device comprising:
   a pinned layer;
   a nonmagnetic spacer layer; and
   a free layer having an easy cone magnetic anisotropy, the nonmagnetic spacer layer residing between the pinned layer and the free layer, the free layer including a high perpendicular anisotropy layer, a negative perpendicular anisotropy layer, an interaction control layer between the high perpendicular anisotropy layer and the negative perpendicular anisotropy layer, an additional negative perpendicular anisotropy layer and an additional interaction control layer, the high perpendicular anisotropy layer and the negative perpendicular anisotropy layer providing the cone anisotropy, the additional interaction control layer residing between the high perpendicular anisotropy layer and the additional negative perpendicular anisotropy layer, the high perpendicular anisotropy layer having a perpendicular anisotropy field of at least one thousand Oersted;
   wherein the magnetic junction is configured such that the free layer is switchable between a plurality of stable magnetic states when a write current is passed through the magnetic junction.

31. A magnetic memory comprising:
   a plurality of magnetic storage cells, each of the plurality of magnetic storage cells including at least one magnetic junction, the at least one magnetic junction including a pinned layer, a nonmagnetic spacer layer, and a free layer having an easy cone magnetic anisotropy, the nonmagnetic spacer layer residing between the pinned layer and the free layer, the free layer including a high perpendicular anisotropy layer, a negative perpendicular anisotropy layer, an interaction control layer between the high perpendicular anisotropy layer and the negative perpendicular anisotropy layer, an additional negative perpendicular anisotropy layer and an additional interaction control layer, the high perpendicular anisotropy layer and the negative perpendicular anisotropy layer providing the cone anisotropy, the additional interaction control layer residing between the high perpendicular anisotropy layer and the additional negative perpendicular anisotropy layer, the high perpendicular anisotropy layer having a perpendicular anisotropy field of at least one thousand Oersted, the magnetic junction being configured such that the free layer is switchable between a plurality of stable magnetic states when a write current is passed through the magnetic junction; and
   a plurality of bit lines.

* * * * *